United States Patent [19]

Ohta et al.

[11] Patent Number: 5,093,210
[45] Date of Patent: Mar. 3, 1992

[54] ELECTROLUMINESCENT DEVICE

[75] Inventors: Masafumi Ohta, Susono; Teruyuki Ohnuma; Fumio Kawamura, both of Shizuoka; Yohta Sakon; Toshihiko Takahashi, both of Numazu, all of Japan

[73] Assignee: Ricoh Company, Ltd., Tokyo, Japan

[21] Appl. No.: 544,905

[22] Filed: Jun. 28, 1990

[30] Foreign Application Priority Data

Jun. 30, 1989 [JP] Japan .................. 1-168826
Jun. 30, 1989 [JP] Japan .................. 1-168827
Feb. 28, 1990 [JP] Japan .................. 2-49796

[51] Int. Cl.$^5$ ............................. H01J 1/62
[52] U.S. Cl. .............................. 428/690; 313/504; 313/506; 428/691; 428/917
[58] Field of Search .............. 428/690, 691, 917; 313/503, 506, 504

[56] References Cited

U.S. PATENT DOCUMENTS 4,741,976 5/1988 Eguchi et al. .................. 428/690

Primary Examiner—James J. Seidleck
Attorney, Agent, or Firm—Oblon, Spivak, McClelland, Maier & Neustadt

[57] ABSTRACT

Disclosed herein is an electroluminescent device having a luminescent layer comprising a luminescent material, which is capable of directly converting the energy of electric field applied thereto into a light energy and capable of providing a large surface-area luminescence.

3 Claims, 1 Drawing Sheet

ELECTROLUMINESCENT DEVICE

BACKGROUND OF THE INVENTION

The present invention relates to an electroluminescent device having a luminescent layer comprising a luminescent material, which is capable of directly converting the energy of electric field applied thereto into a light energy and capable of providing a large surface-area luminescence different from conventional incandescent lamp, fluorescent lamp, light-emitting diode, etc.

The electroluminescent device is classified into the following two groups depending on the luminescent exciting mechanism.

(1) An AC driving-type electroluminescent device of exciting luminescent material by local transfer of electrons or holes in a luminescent layer and emitting light only under an AC electric field.

(2) A DC driving-type electroluminescent device of exciting luminescent material by injection of electrons and holes from electrodes and re-combination of them in a luminescent layer and actuated under a DC electric field.

The AC driving-type electroluminescent device uses a luminescent material composed of an inorganic compound comprising ZnS and Mn, Cu, etc. added thereto, but it involves various drawbacks, for example, that it requires high AC electric field of higher than 200V for driving, needs expensive production cost and shows insufficient luminance and durability.

In the DC driving-type electroluminescent device, high luminance can be obtained since a thin film organic compound has been used as the luminescent layer.

Japanese Patent Application Laid-Open (KOKAI) No. 59-194393, U.S. Pat. No. 4,539,507, Japanese Patent Application Laid-Open (KOKAI) No. 63-295695, U.S. Pat. No. 4,729,432 and Japanese Patent Application Laid-Open (KOKAI) No. 63-264692 disclose electroluminescent devices each comprising an anode, an organic hole injecting and transporting zone, an organic electron injecting luminescent zone and a cathode. As the typical materials used therefor, there can be mentioned, for example, an aromatic tertiary amine as the organic hole injecting and transporting material, and aluminum trisoxine as the organic electron injecting luminescent material.

For instance, Japanese Patent Application Laid-Open (KOKAI) No. 59-194393 (U.S Pat. No. 4,539,507) discloses an electroluminescent device comprising an anode, a hole transporting zone, an organic luminescent zone and a cathode, in which the total film thickness of the anode, the hole transporting zone and the organic luminescent zone is not greater than 1 μm, and at least one of the anode and the cathode allows to permeate at least 80% of radiation rays at a wavelength of not lower than 400 nm, and has at least $9 \times 10^{-5}$ W/W of electric power conversion efficiency. As the fluorescent whitening agent of the electron transporting compound for forming the organic luminescent zone, there are used, for example, 2,5-bis(5,7-di-t-benzyl-2-benzoxazolyl)-1,3,4-thiadiazole;
4,4'-bis(5,7-di-t-benzyl-2-benzoxazolyl)stilbene;
2,5-bis(5,7-di-t-benzyl-2-benzoxazolyl)thiophene;
2,2'-(p-phenylenedivinylene)-bis-benzothiazole;
4,4'-bis (2-benzoxazolyl)biphenyl;
2,5-bis(5(α,α-dimethylbenzyl)-2-benzoxazolyl)thiophene;
4,4'-bis(5,7-di-(2-methyl-2-butyl)-2-benzoxazolyl)stilbene, and 2,5-bis(5,7-di-(2-methyl-2-butyl)-2-benzoxazolyl)-3,4-diphenylthione. As the hole transporting compound, there are disclosed,
1,1-bis(4-di-p-tolylaminophenyl)-4-phenyl-cyclohexane,
1,1-bis(4-di-p-tolylaminophenyl)-cyclohexane;
4,4''-bis(diphenylamino)-quadoriphenyl,
(4-dimethylamino-2-methylphenyl)phenylmethane; and
N,N,N-tri(p-tolyl)amine.

U.S. Pat. No. 4,720,432 discloses an electroluminescent device comprising in sequence, an anode, an organic hole injecting and transporting zone, an organic electron injecting and transporting zone and a cathode, characterized in that the organic hole injecting and transporting zone is composed of a layer in contact with the anode, containing a hole injecting porphyrinic compound and a layer containing a hole transporting aromatic ternary amine interposed between the hole injecting layer and the electron injecting and transporting zone.

Further, Jpn. Journal of Applied Physics, vol. 27, p. 713–715 reports an electrolumiscent device comprising an anode, an organic hole transporting layer, a luminescent layer and an organic electron transporting layer and a cathode. Referring to the material used, there are mentioned, for example, N,N-diphenyl-N,N'-bis(3-methylphenyl)-1,1'-biphenyl-4,4'-diamine as the organic hole transporting material, 3,4,9,10-pentylene tetracarboxylic acid bis benzimidazole as the organic electron transporting material and phthaloperylene as the luminescent material.

These examples show a necessity for studying various characteristics of these organic compounds and effectively combining such characteristics into an electroluminescent device for using such organic compounds as the hole transporting material, luminescent material or electron transporting material. In other word, it is necessary to research and develop organic compounds in a wide range.

However, study for the DC driving electroluminescent device using the organic compounds including the foregoing embodiments as the luminescent material has only a short history and it can not be said that the study for the material and the application thereof to the device has been made sufficiently. Accordingly, there are various problems at present with respect to a further improvement for the luminance, a requirement for more versatile emission wavelength so that luminescent hues such as blue, green and red can be selected precisely in a case of application to a full color display and an improvement for durability.

An offer of an electroluminescent device capable of providing versatile emission wavelength, and giving various luminescent hues and also excellent in durability is strongly demanded.

As a result of the present inventors' earnest studies on the constituent elements of the luminescent layer for overcoming the foregoing problems, it has been found that the foregoing technical problems can be solved by an electroluminescent device comprising an anode, a cathode and one or plurality of organic compound layers sandwiched therebetween, wherein at least one of the said organic compound layers comprises an organic compound represented by the following general formula (II) or (III) as the constituent ingredient:

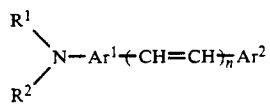

wherein $R^1$ and $R^2$ represent respectively a substituted or unsubstituted alkyl group, a substituted or unsubstituted carbocyclic aromatic ring, or a substituted or unsubstituted heterocyclic aromatic ring, $R^1$ and $R^2$ being possibly joined together to form a ring.

$Ar^1$ and $Ar^2$ represent respectively a substituted or unsubstituted carbocyclic aromatic ring, or a substituted or unsubstituted heterocyclic aromatic ring, and n represents an integer of 1, 2 or 3;

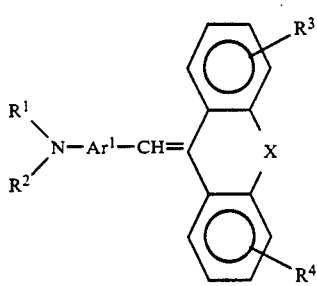

wherein X represents $-CH_2CH_2-$, $-CH=CH-$, $-O-$, $-S-$ or

$R^1$, $R^2$, $R^3$, $R^4$ and $R^5$ represent respectively a substituted or unsubstituted alkyl group, a substituted or unsubstituted carbocyclic aromatic ring, or a substituted or unsubstituted heterocyclic aromatic ring, $R^1$ and $R^2$ being possibly joined together to form a ring, and $Ar^1$ represents a substituted or unsubstituted carbocyclic aromatic ring, or a substituted or unsubstituted heterocyclic aromatic ring.

The present invention has been attained based on this finding.

SUMMARY OF THE INVENTION

In an aspect of the present invention, there is provided an electroluminescent device comprising an anode, a cathode and one or plurality of organic compound layers sandwiched therebetween, at least one of the said organic compound layers comprising as a constituent ingredient an organic compound represented by the following general formula (I):

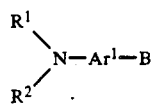

wherein $R^1$ and $R^2$ represent respectively a substituted or unsubstituted ($C_1$-$C_{20}$) alkyl group, a substituted or unsubstituted carbocyclic aromatic ring, or a substituted or unsubstituted (5-7 membered) heterocyclic aromatic ring, $R^1$ and $R^2$ being possibly joined together to form a (5-15 membered) ring, $Ar^1$ represents a substituted or unsubstituted carbocyclic aromatic ring, or a substituted or unsubstituted (5-13 membered) heterocyclic aromatic ring, B represents $-CH=CH-{}_nAr^2$ or

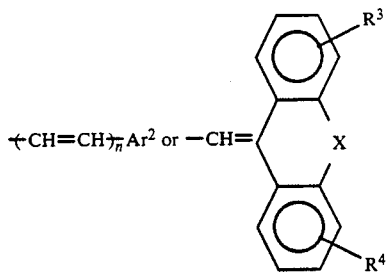

(wherein X represents $-CH_2CH_2-$, $-CH=CH-$, $-O-$, $-S-$ or

$R^3$, $R^4$ and $R^5$ represent respectively a substituted or unsubstituted ($C_1$-$C_{18}$) alkyl group, a substituted or unsubstituted carbocyclic aromatic ring, or a substituted or unsubstituted (6-membered) heterocyclic aromatic ring, $Ar^2$ represent a substituted or unsubstituted carbocyclic aromatic ring, or a substituted Or unsubstituted (5-13 membered) heterocyclic aromatic ring, and n represents an integer of 1, 2 or 3).

DETAILED DESCRIPTION OF THE INVENTION

Figure 1:
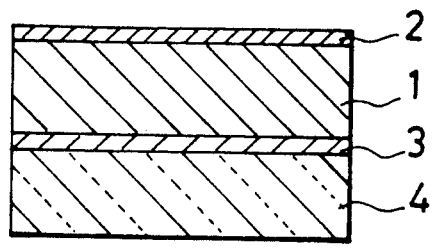
FIGS. 1-3 are schematic cross sectional views for typical electroluminescent device according to the present invention.

The organic compound constituting the organic compound layer in the present invention is represented by the following general formula:

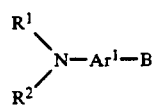

wherein $R^1$ and $R^2$ represent respectively a substituted or unsubstituted ($C_1$-$C_{20}$) alkyl group, a substituted or unsubstituted carbocyclic aromatic ring, or a substituted or unsubstituted (5-7 membered) heterocyclic aromatic ring, $R^1$ and $R^2$ being possibly joined together to form a (5-15 membered) ring, $Ar^1$ represents a substituted or unsubstituted carbocyclic aromatic ring, or a substituted or unsubstituted (5-13 membered) heterocyclic aromatic ring., in which the said substituent is ($C_1$-$C_6$) alkyl, ($C_1$-$C_6$) alkoxy or halogen atom, B represents $-CH=CH-{}_nAr^2$ or

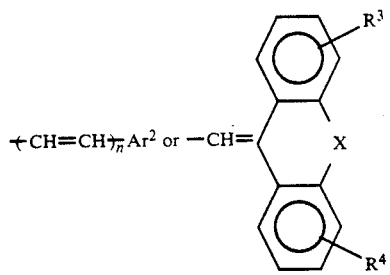

(wherein X represents —CH$_2$CH$_2$—, —CH=CH—, —O—, —S— or

R$^3$, R$^4$ and R$^5$ represent respectively a substituted or unsubstituted (C$_1$–C$_{12}$) alkyl group, a substituted or unsubstituted carbocyclic aromatic ring, or a substituted or unsubstituted (6-membered) heterocyclic aromatic ring, Ar$^2$ represent a substituted or unsubstituted carbocyclic aromatic ring, or a substituted or unsubstituted (5-13 membered) heterocyclic aromatic ring, in which the said substituent is (C$_1$–C$_6$) alkyl, (C$_1$–C$_6$) alkoxy or halogen atom, and n represents an integer of 1, 2 or 3).

In the general formula (I), as the carbocyclic or heterocyclic aromatic ring used for R$^1$, R$^2$, R$^3$, R$^4$, R$^5$ and Ar$^2$, phenyl, naphthyl, anthryl, acenaphthenyl, fluorenyl, phenanthryl, pyridyl, pyrimidyl, furanyl, pyrrolyl, thiophenyl, quinolyl, benzofuranyl, benzothiophenyl, indolyl, carbazolyl, benzoxazolyl and quinoxalyl may be exemplified.

As the carbocyclic or heterocyclic aromatic ring used for Ar$^1$, phenylene, naphthylene, furandiyl, thiophendiyl, pyridinediyl, quinolinediyl and benzofurandiyl may be exemplified.

The alkyl group used for R$^1$ and R$^2$, is linear or branched C$_1$–C$_{20}$ alkyl group, preferably C$_1$–C$_{12}$ alkyl group which may further contain halogen atom, hydroxy group, cyano group, alkoxy group, or substituted or not-substituted phenyl group.

The alkyl group used for R$^3$, R$^4$ and R$^5$ is, linear or branched C$_1$–C$_{12}$, preferably C$_1$–C$_6$ alkyl group which may further contain halogen atom, hydroxy group, cyano group, alkoxy group, or substituted or not-substituted phenyl group. Further, as the substituent for R$^1$, R$^2$, R$^3$, R$^4$, R$^5$, Ar$^1$ and Ar$^2$ in the general formula (I), the followings can be exemplified:

(1) Halogen atom, trifluoromethyl group, cyano group and nitro group;

(2) Alkyl group; a linear or branched (C$_1$–C$_{20}$) alkyl group, preferably (C$_1$–C$_{12}$) alkyl group, which may further contain hydroxy group, cyano group, (C$_1$–C$_{12}$) alkoxy group, halogen atom, phenyl group, or a phenyl group substituted with (C$_1$–C$_{12}$) alkyl group or (C$_1$–C$_{12}$) alkoxy group.

(3) Alkoxy group (—OR$^6$); in which R$^6$ represents the alkyl group as defined in (2) above.

(4) Aryloxy group; in which phenyl group or naphthyl group can be mentioned as the aryl group, [the aryl group may contain (C$_1$–C$_{12}$) alkoxy group, (C$_1$–C$_{12}$) alkyl group or halogen atom as the substituent].

(5) Alkylmercapto group (SR$^6$); in which R$^6$ represents the alkyl group as defined in (2) above.

(6)

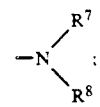

in which R$^7$ and R$^8$ represent independently hydrogen atom, alkyl group defined in (2) above, acyl group such as acetyl group or benzoyl group or aryl group such as phenyl group, biphenylyl group or naphthyl group [these acyl group and aryl group may contain (C$_1$–C$_{12}$) alkoxy group, (C$_1$–C$_{12}$) alkyl group or halogen atom as the substituent]. R$^7$ and R$^8$ may join together with a nitrogen atom to form a ring as in piperidyl group or morpholyl group. Further, they may form a ring together with the carbon atom on the aryl group as in jurolidyl group.

(7) Alkoxycarbonyl group (—COOR$^9$); in which R$^9$ represents the alkyl group as defined in (2) or the aryl group as defined in (4).

(8) Acyl group (COR$^9$); sulfonyl group (—SO$_2$R$^9$), carbamoyl group

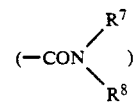

or sulfamoyl group

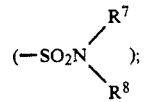

in which R$^7$, R$^8$ and R$^9$ are the same meanings as defined above except for the case where R$^7$ and R$^8$ form a ring together with a carbon atom on the aryl group.

(9) Alkylenedioxy group or alkylenedithio group such as methylenedioxy group or methylene thio group.

As preferred examples for R$^1$, R$^2$, R$^3$, R$^4$, R$^5$, Ar$^1$, Ar$^2$ and X in the general formula (I), the followings can be mentioned:

R$^1$, R$^2$ and R$^5$ represent respectively hydrogen, (C$_1$–C$_{12}$) alkyl group, benzyl group, (C$_1$, C$_6$) alkyl-substituted benzyl group, (C$_1$–C$_6$) alkoxy-substituted benzyl group, halogen-substituted benzyl group, phenyl group, (C$_1$–C$_6$) alkyl phenyl group, (C$_1$–C$_6$) alkoxy-substituted phenyl group, (C$_1$–C$_{12}$) dialkylamino-substituted phenyl group, cyano-substituted phenyl group, halogen-substituted phenyl group, naphthyl group, (C$_1$–C$_6$) alkyl-substituted naphthyl group, (C$_1$–C$_6$) alkoxy-substituted naphthyl group, (C$_1$–C$_{12}$) dialkylamino-substituted naphthyl group, cyano-substituted naphthyl group, halogen-substituted naphthyl group, pyridyl group, (C$_1$–C$_6$) alkyl-substituted pyridyl dialkylamino-substituted pyridyl group, cyano-substituted pyridyl group, halogen-substituted pyridyl group, thiophenyl group, (C$_1$–C$_6$) alkyl-substituted thiophenyl group, (C$_1$–C$_{12}$) alkoxy-substituted thiophenyl group, (C$_1$–C$_6$) dialkylamino-substituted thiophenyl group, cyano-substituted thiophenyl group, halogen-substituted thiophenyl group, furanyl group, ($C_1$-$C_6$) alkyl-substituted furanyl group, ($C_1$-$C_6$), alkoxy-substituted furanyl group, ($C_1$-$C_{12}$) dialkylamino-substituted furanyl group, cyano-substituted furanyl group, or halogen-substituted furanyl group; and more preferably, ($C_1$-$C_{12}$) alkyl group, phenyl group or naphthyl group.

$R^3$ and $R^4$ represent respectively hydrogen, ($C_1$-$C_{12}$) alkyl group, ($C_1$-$C_{12}$) alkoxy group, cyano group, phenyl group, phenoxy group or halogen atom; and more preferably, hydrogen or ($C_1$-$C_{12}$) alkyl group.

$Ar^1$ represents phenylene, naphthylene, furandiyl, thiophenediyl or pyridinediyl.

$Ar^2$ represents phenyl group, ($C_1$-$C_{12}$) alkyl-substituted phenyl group, ($C_1$-$C_{12}$) alkoxy-substituted phenyl group, phenoxy-substituted phenyl group, nitro-substituted phenyl group, cyano-substituted phenyl group, halogen-substituted phenyl group, naphthyl-group, ($C_1$-$C_{12}$) alkyl-substituted naphthyl group, ($C_1$-$C_{12}$) alkoxy-substituted naphthyl group, phenoxy-substituted naphthyl group, nitro-substituted naphthyl group, cyano-substituted naphthyl group, halogen-substituted naphthyl group, pyridyl group, ($C_1$-$C_{12}$) alkyl-substituted pyridyl group, ($C_1$-$C_{12}$) alkoxy-substituted pyridyl group, phenoxy-substituted pyridyl group, nitro-substituted pyridyl group, cyano-substituted pyridyl group, halogen-substituted pyridyl group, quinolyl group, ($C_1$-$C_{12}$) alkyl-substituted quinolyl group, ($C_1$-$C_{12}$) alkoxy-substituted quinolyl group, phenoxy-substituted quinolyl group, nitro-substituted quinolyl group, cyano-substituted quinolyl group, halogen-substituted quinolyl group, thiophenyl group, ($C_1$-$C_{12}$) alkyl-substituted thiophenyl group, ($C_1$-$C_{12}$) alkoxy-substituted thiophenyl group, phenoxy-substituted thiophenyl group, nitro-substituted thiophenyl group, cyano-substituted thiophenyl group, halogen-substituted thiophenyl group, furanyl group, ($C_1$-$C_{12}$) alkyl-substituted furanyl group, ($C_1$-$C_{12}$) alkoxy-substituted furanyl group, phenoxy-substituted furanyl group, nitro-substituted furanyl group, cyano-substituted furanyl group, halogen-substituted furanyl group, benzothiophenyl group, ($C_1$-$C_{12}$) alkyl-substituted benzothiophenyl group, ($C_1$-$C_{12}$) alkoxy-substituted benzothiophenyl group, phenoxy-substituted benzothiophenyl group, nitro-substituted benzothiophenyl group, cyano-substituted benzothiophenyl group, halogen-substituted benzothiophenyl group, benzofuranyl group, ($C_1$-$C_{12}$) alkyl-substituted benzofuranyl group, ($C_1$-$C_{12}$) alkoxy-substituted benzofuranyl group, phenoxy-substituted benzofuranyl group, nitro-substituted benzofuranyl group, cyano-substituted benzofuranyl group, or halogen-substituted benzofuranyl group; and more preferably, phenyl group or naphthyl group.

X represents —$CH_2CH_2$—, —CH=CH—, —O—, —S—,

As the compound included in the general formula (I), there can be exemplified the followings:

(E-1)

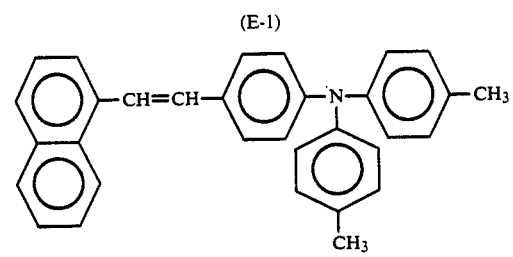

(Compound No. 1)

(E-2)

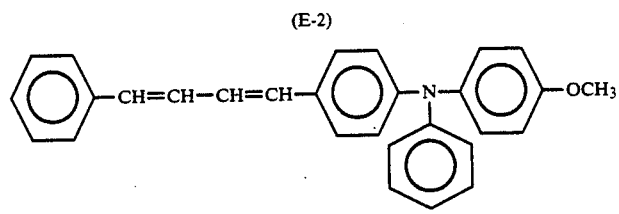

(Compound No. 2)

(E-3)

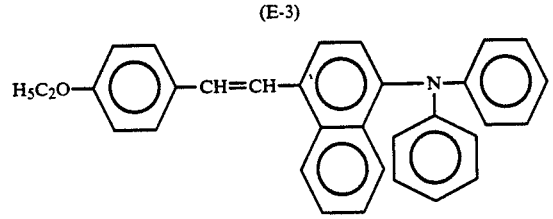

(Compound No. 3)

(E-4)

-continued
(Compound No. 4)
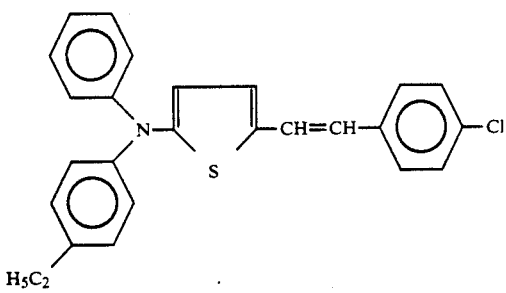
(E-5)
(Compound No. 5)
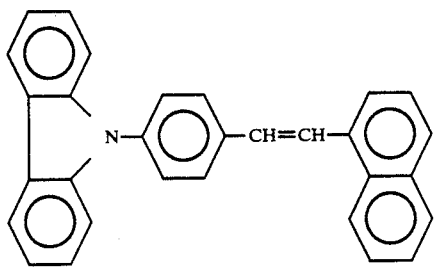
(E-6)
(Compound No. 6)
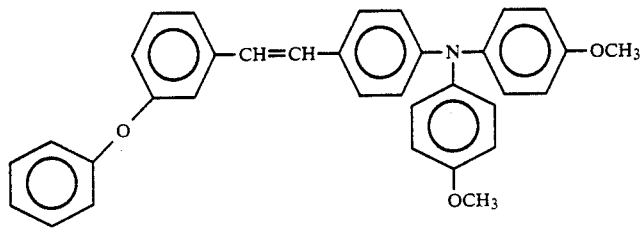
(E-7)
(Compound No. 7)
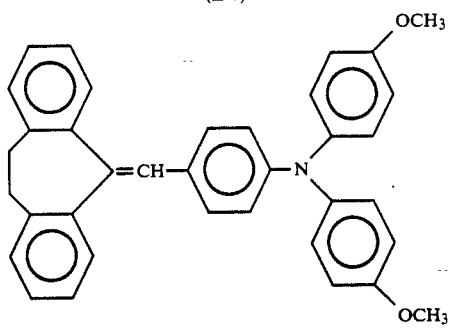
(E-8)
(Compound No. 8)
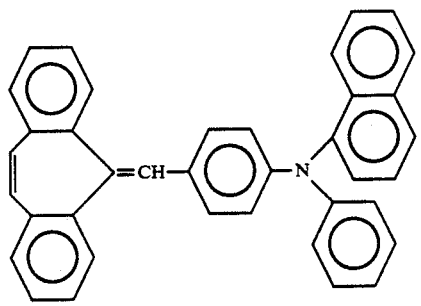
(E-9)

-continued
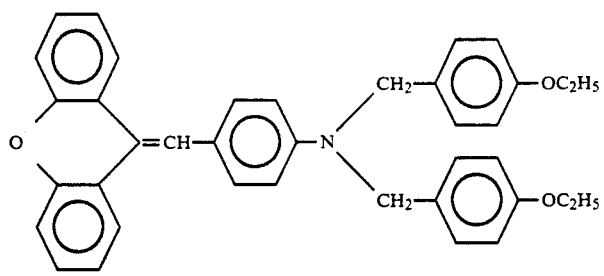
(E-10)
(Compound No. 9)
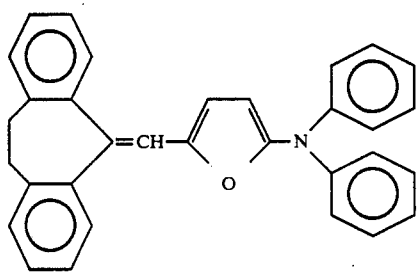
(E-11)
(Compound No. 10)
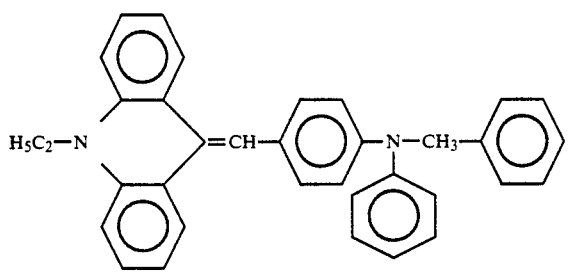
(E-12)
(Compound No. 11)
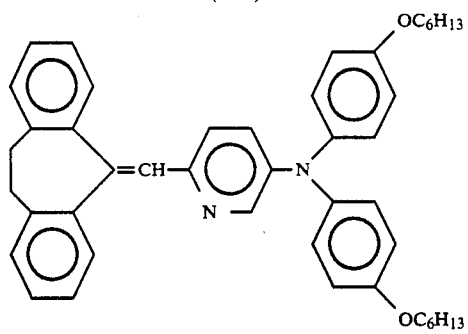
(E-13)
(Compound No. 12)
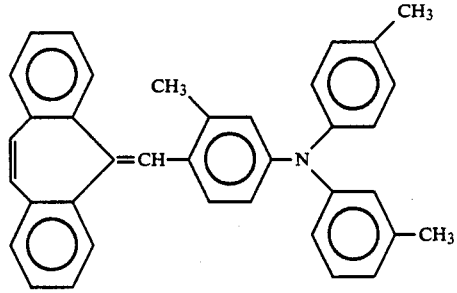
(E-14)
(Compound No. 13)

-continued
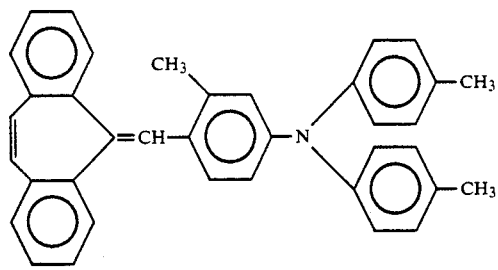
(T-2) (Compound No. 14)
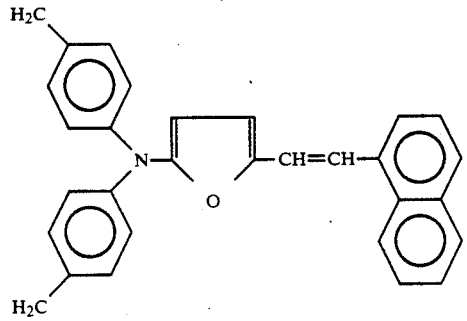
(T-3) (Compound No. 15)
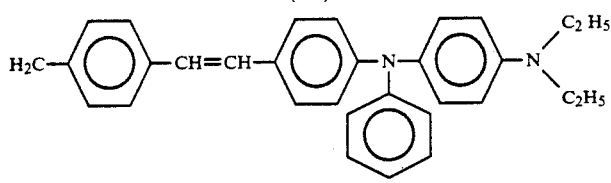
(T-4) (Compound No. 16)
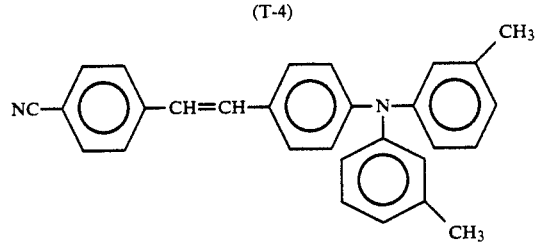
(T-5) (Compound No. 17)
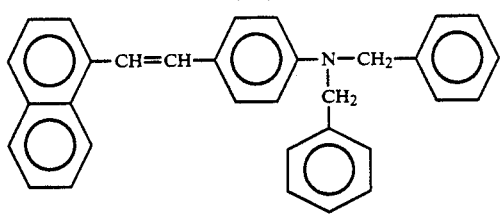
(T-6) (Compound No. 18)
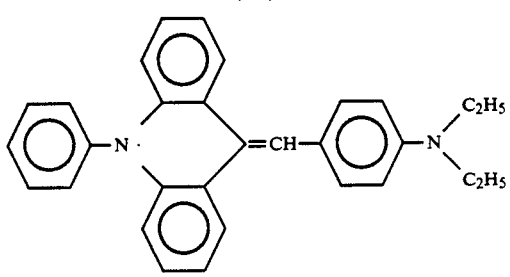
(T-7) (Compound No. 19)

-continued
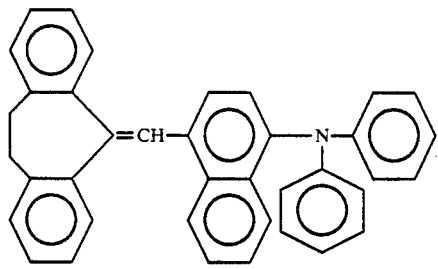
(T-8)
(Compound No. 20)
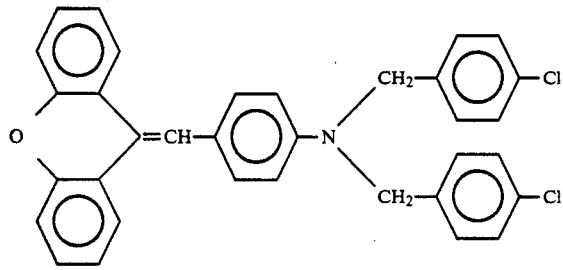
(T-9)
(Compound No. 21)
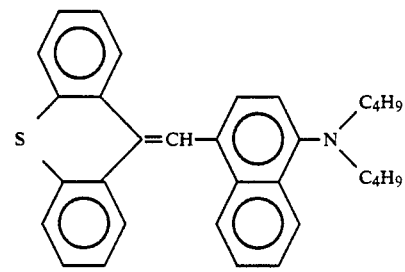
(T-10)
(Compound No. 22)
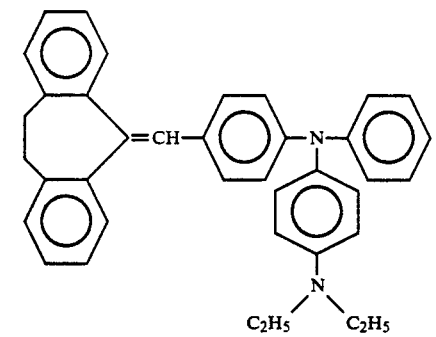
(T-11)
(Compound No. 23)
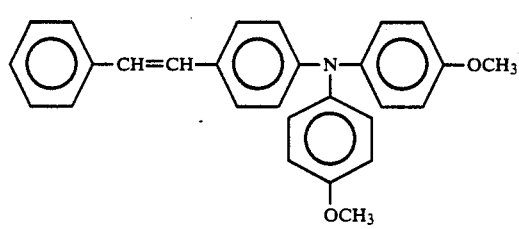
(T-12)
(Compound No. 24)

-continued (Compound No. 25)

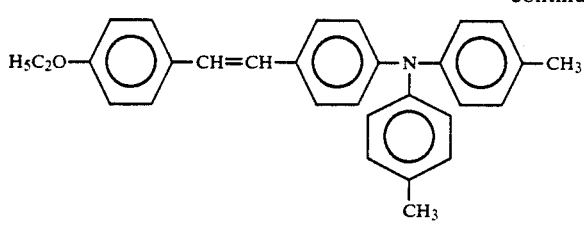

(T-13)

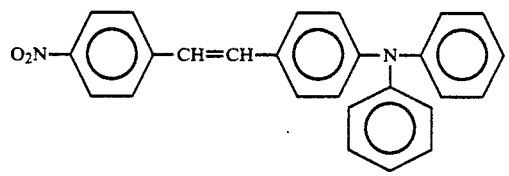

(Compound No. 26)

(T-14)

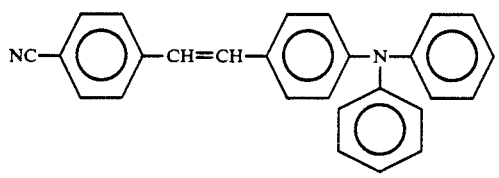

(Compound No. 27)

(T-15)

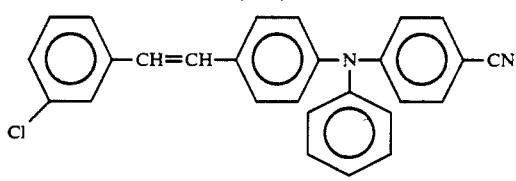

(Compound No. 28)

(T-16)

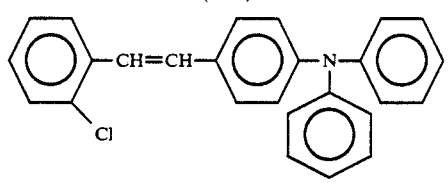

(Compound No. 29)

The electroluminescent device in the present invention is constituted by forming the organic compound as described above into a thin film with a thickness of not greater than 2 μm, preferably from 0.05 to 0.5 μm for the entire organic compound layer(s), for example, by means of vacuum vapor deposition method or solution coating method to form a luminescent layer, and sandwiching the luminescent layer between the anode and the cathode.

The present invention will be described more specifically referring to the drawings.

FIG. 1 shows a typical example of the electroluminescent device according to the present invention, in which an anode 3, a luminescent layer 1 and a cathode 2 are successively disposed on a substrate 4.

The electroluminescent device shown in FIG. 1 is particularly useful in a case where the compound used has by itself such characteristics as hole transporting property, electron transporting property and luminescent property, or compounds having respective properties are used in admixture.

Figure 2:
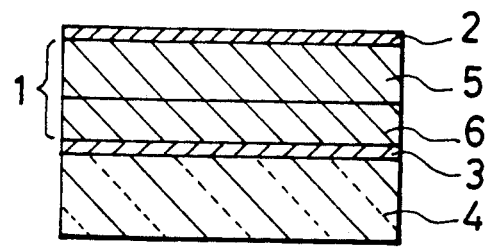

FIG. 2 shows an example of an electroluminescent device according to the present invention, in which an anode 3, a luminescent layer 1 comprising a hole transporting layer 6 and an electron transporting layer 5, and a cathode 2 successively disposed on a substrate 4.

In FIG. 2, the luminescent layer 2 is composed of the combination of a hole transporting compound layer and an electron transporting compound layer. In this constitution, preferred properties of organic compounds are combined for smoothly injecting holes or electrons from electrodes by combining compound layers excellent in hole transporting property or electron transporting property, thereby obtaining a device of excellent luminescent property. In the case of the electroluminescent device of this type, it can not be determined generally as to which of the compounds emits light and it differs depending on the organic compounds to be combined.

Figure 3:
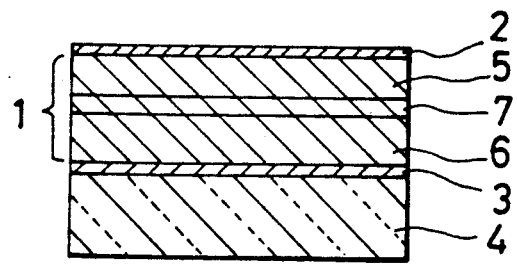

FIG. 3 shows one embodiment of an electroluminescent device according to the present invention, in which an anode 3 a luminescent layer 1 comprising a hole transporting layer 6, a light-emitting layer 7 and an electron disposed on a substrate 4.

In FIG. 3, a luminescent layer is formed by the combination of the hole transporting compound layer, a light-emitting compound layer and an electron transporting compound layer, which can be considered to be of such a type that the concept of separating functions as described above is further advanced.

The thickness of the luminescent layer in the present invention is not greater than 2 μm and, preferably from 0.05 to 0.5 μm.

Since the electroluminescent device of this type can be obtained by properly combining the compounds suitable to each of the characteristics, that is, hole transporting property, electron transporting property and light-emitting property, the range for selecting the compounds is extremely extended. Accordingly, various advantages are provided such that their selection is facilitated and since various compounds of different emission wavelength can be used, luminescent hues of the device can be made more versatile.

Any of the compounds according to the present invention is excellent in the luminescent property and can constitute a luminescent layer of a structure as shown in FIGS. 1, 2 and 3.

Further, in the present invention, it is possible to provide both of a compound of excellent hole transporting property and a compound of excellent electron transporting property by properly selecting the kinds of substituents in the general formula (I) described above.

Accordingly, in the case of the constitution as shown in FIGS. 2 and 3, two or more of the compounds represented by the general formula (I) can be used as the luminescent layer-forming ingredient.

In the present invention, the compound represented by the general formula (I) is used as the luminescent layer-forming ingredients, however, it is possible, if necessary, to use an aromatic tertiary amine or N,N'-diphenyl-N,N'-bis(3-methylphenyl)-1,1'-biphenyl-4,4'-diamine as the hole transporting compound, and aluminum trisoxy or perylene tetracarboxylic acid derivative a the electron transporting compound.

In the electroluminescent device according to the present invention, the thickness of the hole transporting layer is not greater than 2000 Å and the thickness of the electron transporting layer is not greater than 2000 Å.

The electroluminescent device according to the present invention emits light by the application an electrical bias to the luminescent layer. Since short-circuit may possibly be caused even with slight pin-holes, thereby hindering the function of the device, it is preferable to use a compound of an excellent film-forming property in combination for forming the luminescent layer. Further, a luminescent layer can also be formed by combining a compound of such excellent film-forming property, for example, with a polymer binder. As the polymer binder usable herein, there can be mentioned, for example, polystyrene, polyvinyltoluene, poly-N-vinylcarbazole, polymethyl methacrylate, polymethyl acrylate, polyester, polycarbonate and polyamide. Further, for improving the efficiency of injecting charges from the electrode, a charge injecting and transporting layer can be disposed separately between the electrodes.

As the anode material, there can be used nickel, gold, platinum, palladium or an alloy thereof; a metal compound of great working function such as tin oxide ($SnO_2$), tin-indium oxide (ITO) and copper iodide; alloy thereof; compound thereof or; an electroconductive polymer such as poly-(3-methylthiophene) and polypyrrole. The thickness of the anode is from 100 to 5000 Å.

As the cathode material, there can be mentioned a metal of small working function such as silver, tin, lead, magnesium, manganeses, aluminum or an alloy thereof.

At least one of the materials used for the anode and the cathode is preferably transparent enough in a emission wavelength region of the device. Specifically, it is preferable that the material has a light transmittance of higher than 80%. The thickness of the cathode is not less than 500 Å.

In the present invention, it is preferable that a transparent anode is disposed on a transparent substrate to form a constitution as shown in FIG. 1–FIG. 3. Depending on the case, the constitution may be reversed. Further, as the transparent substrate, there can be mentioned glass or plastic film.

Further in the present invention, a protection layer may be disposed separately or an entire device is put into a cell with a silicon oil being sealed therein for improving the stability, in particular, for protection against atmospheric moisture of the thus obtained electroluminescent device.

In the electroluminescent device according to the present invention, since the compound represented by the general formula (I) is used as the constituent material for the organic compound layer, light emission at high luminance (not less than 10 $cd/m^2$, preferably not less than 100 $cd/m^2$) can be obtained for a long period of time even under a low driving voltage (not more than 50V, preferably 5 to 30V) and it can provide various emission colors together with excellent durability.

EXAMPLES

The present invention will be more precisely explained while referring to Examples as follows.

However, the present invention is not restricted to Examples under mentioned. From the foregoing description, one skilled in the art can easily ascertain the essential characteristics of the present invention, and without departing form the spirit and scope thereof, can make various changes and modifications of the invention to adapt it to various usages and conditions.

EXAMPLE 1

As an anode, a glass substrate (manufactured by Hoya Co.) formed with a thin film of indium-tin oxide (ITO) of 500 Å in thickness was cleaned with a neutral detergent and then cleaned by supersonic waves in ethanol for about 10 min. The substrate was placed in a boiling ethanol for about one min. and then, after taking out from ethanol, it was directly dried under blowing. Then, a fluorescent organic compound layer (luminescent layer) was formed by vapor-depositing under vacuum a compound represented by the following formula (E-1) on the glass substrate by using an ohmic heating source which could set a heating temperature and control the vacuum vapor-deposition rate. That is, a tantalum board containing a compound represented by the general formula (E-1) was controlled by a temperature controller, so that the vacuum vapor-deposition rate was kept at 2 Å/s. Upon vacuum vapor-deposition, the vacuum degree was $0.7 \times 10^{-7}$ Torr and the substrate temperature was 20° C. The film thickness of the deposited layer formed on ITO was 500 Å.

Then, an oxadiazole derivative represented by the following formula (T-1) as an electron transporting substance was vapor-deposited under vacuum on the luminescent layer by using an ohmic heating source which could set a heating temperature and control the vacuum vapor-deposition rate, thereby obtaining an electron transporting layer to a thickness of 500 Å. That is, the temperature of the board containing the compound represented by the following formula (T-1) was controlled and the vacuum vapor-deposition rate was kept at 2 Å/s.

Then, a cathode was vapor-deposited under vacuum with Mg-Ag to a thickness of 1500 Å on the electron transporting layer.

An external power source was connected to the thus prepared luminescent device and, when a current was supplied, clear luminescence was confirmed upon applying a positive bias voltage on the side of the anode. Further, the device could be operated in air sufficiently removed with humidity.

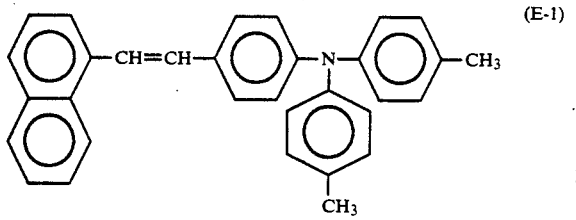

(E-1)

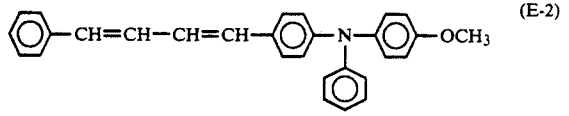

(T-1)

EXAMPLE 2

A luminescent device was prepared in the same procedures as those in Example 1 except for using a compound represented by the following formula (E-2) as the luminescent substance. The resultant luminescent device exhibited distinct luminescence in a case of applying a positive bias voltage on the side of the anode.

Further, the luminescent device could be operated in air state sufficiently removed with humidity.

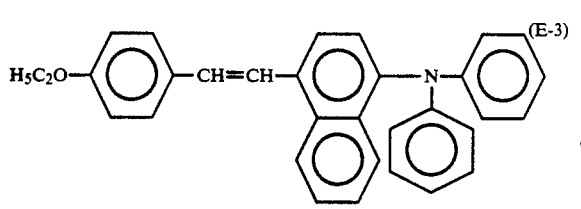

(E-2)

EXAMPLE 3

A luminescent device was prepared in the same procedures as those in Example 1 except for using a compound represented by the following formula (E-3) as the luminescent substance. The resultant luminescent device exhibited distinct luminescence in a case of applying a positive bias voltage on the side of the anode.

Further, the luminescent device could be operated in air state sufficiently removed with humidity.

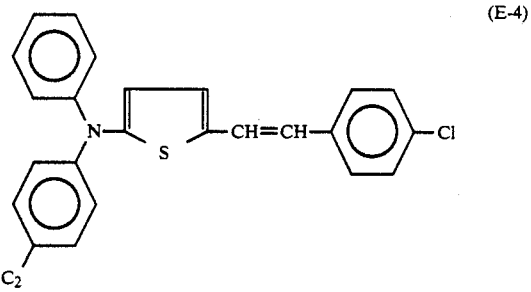

(E-3)

EXAMPLE 4

A luminescent device was prepared in the same procedures as those in Example 1 except for using a compound represented by the following formula (E-4) as the luminescent substance. The resultant luminescent device exhibited distinct luminescence in a case of applying a positive bias voltage on the side of the anode.

Further, the luminescent device could be operated in air state sufficiently removed with humidity.

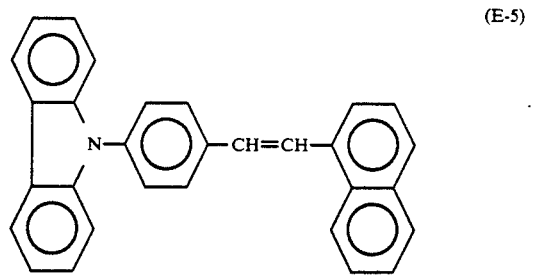

(E-4)

EXAMPLE 5

A luminescent device was prepared in the same procedures as those in Example 1 except for using a compound represented by the following formula (E-5) as the luminescent substance. The resultant luminescent device exhibited distinct luminescence in a case of applying a positive bias voltage on the side of the anode.

Further, the luminescent device could be operated in air state sufficiently removed with humidity.

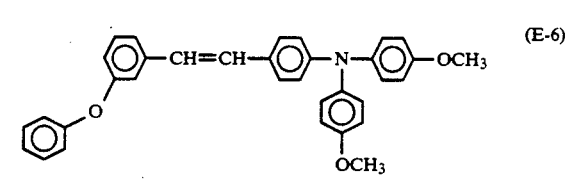

(E-5)

EXAMPLE 6

A luminescent device was prepared in the same procedures as those in Example 1 except for using a compound represented by the following formula (E-6) as the luminescent substance. The resultant luminescent device exhibited distinct luminescence in a case of applying a positive bias voltage on the side of the anode.

Further, the luminescent device could be operated in air state sufficiently removed with humidity.

(E-6)

EXAMPLE 7

A luminescent device was prepared in the same procedures as those in Example 1 except for using a compound represented by the following formula (E-7) as the luminescent substance. The resultant device exhibited distinct luminescence in a case of applying a positive bias voltage on the side of the anode.

Further, the luminescent device could be operated in air state sufficiently removed with humidity.

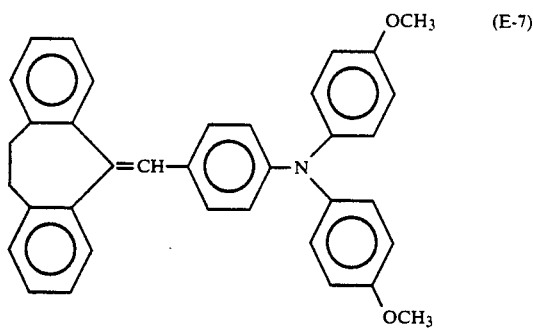
(E-7)

EXAMPLE 8

A luminescent device was prepared in the same procedures as those in Example 1 except for using a compound represented by the following formula (E-8) as the luminescent substance. The resultant luminescent device exhibited distinct luminescence in a case of applying a positive bias voltage on the side of the anode.

Further, the luminescent device could be operated in air state sufficiently removed with humidity.

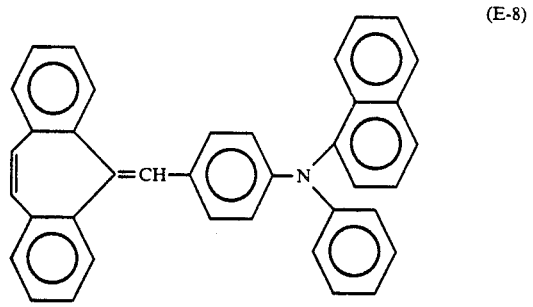
(E-8)

EXAMPLE 9

A luminescent device was prepared in the same procedures as those in Example 1 except for using a compound represented by the following formula (E-9) a the luminescent substance. The resultant luminescent device exhibited distinct luminescence in a case of applying a positive bias voltage on the side of the anode. , Further, the luminescent device could be operated in air state sufficiently removed with humidity.

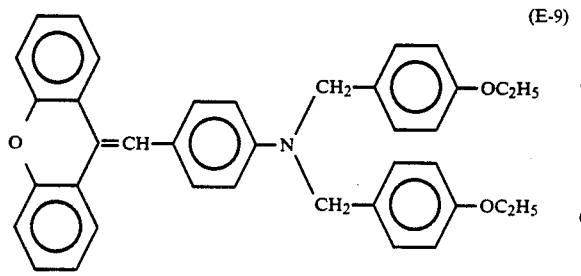
(E-9)

EXAMPLE 10

A luminescent device was prepared in the same procedures as those in Example 1 except for using a compound represented by the following formula (E-10) as the luminescent substance. The resultant luminescent device exhibited distinct luminescence in a case of applying a positive bias voltage on the side of the anode.

Further, the luminescent device could be operated in air state sufficiently removed with humidity.

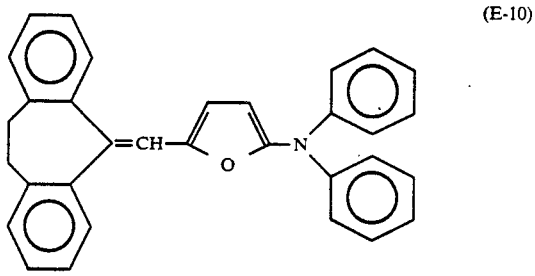
(E-10)

EXAMPLE 11

A luminescent device was prepared in the same procedures as those in Example 1 except for using a compound represented by the following formula (E-11) as the luminescent substance. The resultant luminescent device exhibited distinct luminescence in a case of applying a positive bias voltage on the side of the anode.

Further, the luminescent device could be operated in air state sufficiently removed with humidity.

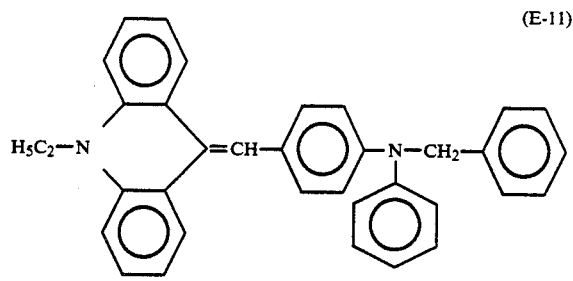
(E-11)

EXAMPLE 12

A luminescent device was prepared in the same procedures as those in Example 1 except for using a compound represented by the following formula (E-12) as the luminescent substance. The resultant luminescent device exhibited distinct luminescence in a case of applying a positive bias voltage on the side of the anode.

Further, the luminescent device could be operated in air state sufficiently removed with humidity.

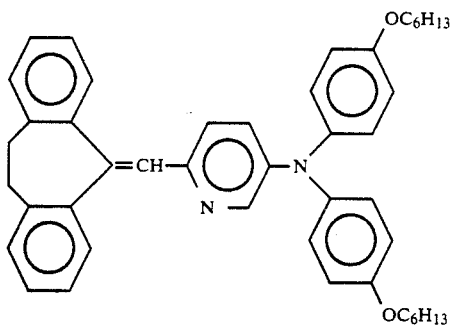

(E-12)

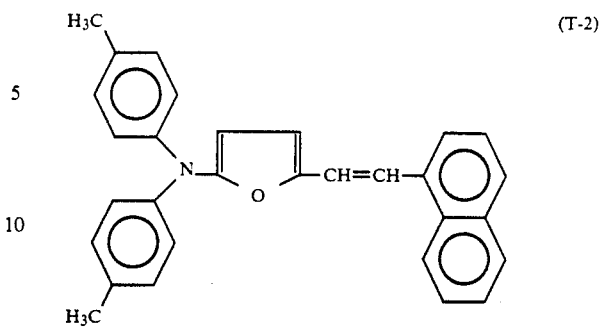

(T-2)

EXAMPLE 13

A luminescent device was prepared in the same procedures as those in Example 1 except for using a compound represented by the following formula (E-13) as the luminescent substance. The resultant luminescent device exhibited distinct luminescence in a case of applying a positive bias voltage on the side of the anode.

Further, the luminescent device could be operated in air state sufficiently removed with humidity.

Then, a 12-phthaloperynone derivative of the formula:

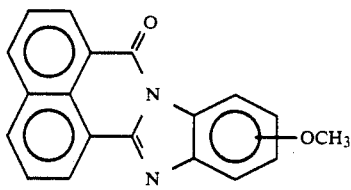

was vapor-deposited under vacuum as a luminescent layer to a thickness of about 1500 Å. Further, a perylene derivative of the formula:

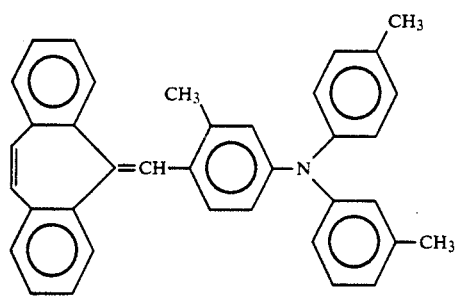

(E-13)

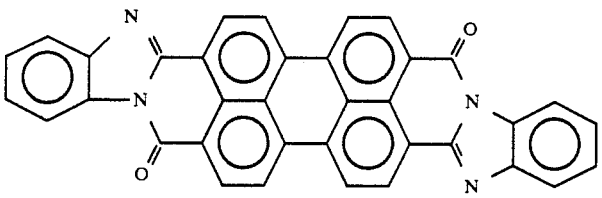

was vapor-deposited under vacuum thereover to a thickness of about 1000 Å as an electron transporting layer. Further thereover, aluminum was vapor-deposited under vacuum as a cathode to a thickness of about 1000 Å, thereby obtaining an electroluminescent device of the structure as shown in FIG. 1. All of the materials were vapor-deposited under vacuum by ohmic heating. Lead wires were led out from the anode and the cathode and connected to a DC current source. When current was supplied, distinct electroluminescent-emission was observed.

EXAMPLE 15

A luminescent device was prepared in the same procedures as those in Example 14 except for using the compound represented by the following formula (T-3) as a hole transporting substance. The resultant luminescent device exhibited distinct luminescence when applying a positive bias voltage on the side of the anode.

Further, the luminescent device could be operated in air state sufficiently removed with humidity.

EXAMPLE 14

A non-alkali borosilicate glass of 1.1 mm in thickness was used as a substrate and, after sufficiently cleaning, gold was vapor-deposited under vacuum thereon as an anode to a thickness of 200 Å. Then, the compound represented by the following formula (T-2) was vapor-deposited under vacuum as a hole transporting layer to form a hole transporting layer of 800 Å in thickness.

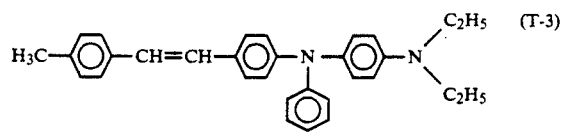

(T-3)

EXAMPLE 16

A luminescent device was prepared in the same procedures as those in Example 14 except for using the compound represented by the following formula (T-4) as a hole transporting substance. The resultant luminescent device exhibited distinct luminescence when applying a positive bias voltage on the side of the anode.

Further, the luminescent device could be operated in air state sufficiently removed with humidity.

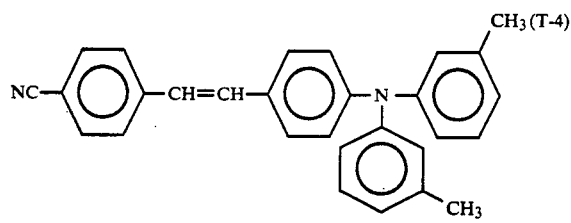

EXAMPLE 17

A luminescent device as prepared in the same procedures as those in Example 14 except for using the compound represented by the following formula (T-5) as a hole transporting substance. The resultant luminescent device exhibited distinct luminescence when applying a positive bias voltage on the side of the anode.

Further, the luminescent device could be operated in air state sufficiently removed with humidity.

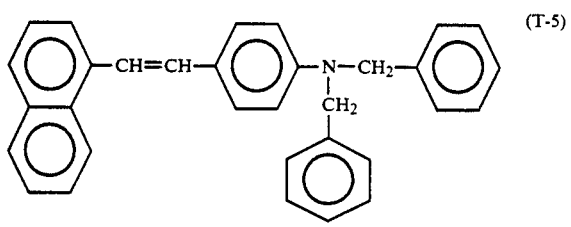

EXAMPLE 18

A luminescent device was prepared in the same procedures as those in Example 14 except for using the compound represented by the following formula (T-6) as a hole transporting substance. The resultant luminescent device exhibited distinct luminescence when applying a positive bias voltage on the side of the anode.

Further, the luminescent device could be operated in air state sufficiently removed with humidity.

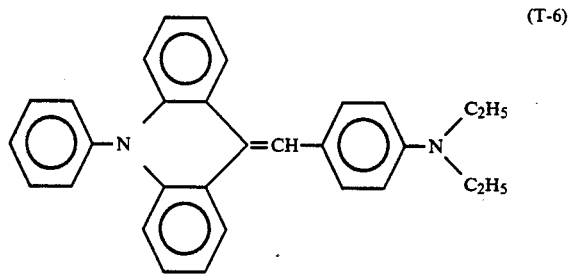

EXAMPLE 19

A luminescent device was prepared in the same procedures as those in Example 14 except for using the compound represented by the following formula (T-7) as a hole transporting substance. The resultant luminescent device exhibited distinct luminescence when applying a positive bias voltage on the side of the anode.

Further, the luminescent device could be operated in air state sufficiently removed with humidity.

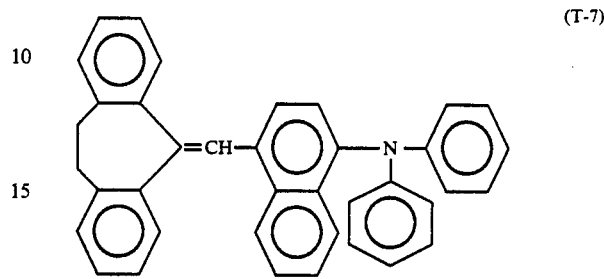

EXAMPLE 20

A luminescent device was prepared in the same procedures as those in Example 14 except for using the compound represented by the following formula (T-8) as a hole transporting substance. The resultant luminescent device exhibited distinct luminescence when applying a positive bias voltage on the side of the anode.

Further, the luminescent device could be operated in air state sufficiently removed with humidity.

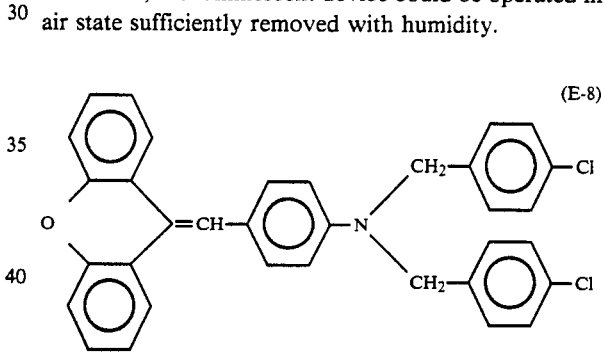

EXAMPLE 21

A luminescent device was prepared in the same procedures as those in Example 14 except for using the compound represented by the following formula (T-9) as a hole transporting substance. The resultant luminescent device exhibited distinct luminescence when applying a positive bias voltage on the side of the anode.

Further, the luminescent device could be operated in air state sufficiently removed with humidity.

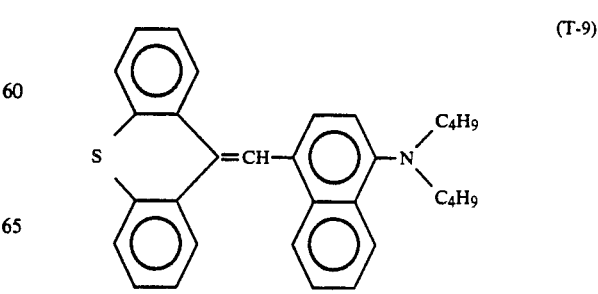

EXAMPLE 22

A luminescent device was prepared in the same procedures as those in Example 14 except for using the compound represented by the following formula (T-10) as a hole transporting substance. The resultant luminescent device exhibited distinct luminescence when applying a positive bias voltage on the side of the anode.

Further, the luminescent device could be operated in air state sufficiently removed with humidity.

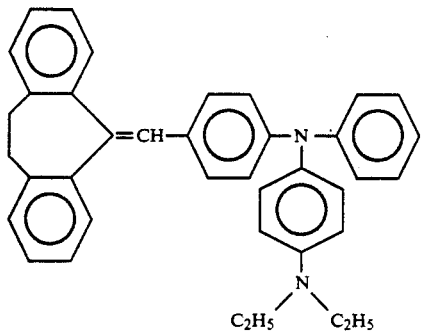

(T-10)

The characteristics of the obtained electroluminescent devices in Examples 1-22 are shown in Table.

TABLE 1

| Example | Color of light | Driving current (mA/cm$^2$) | Luminance (cd/m$^2$) |
|---|---|---|---|
| 1 | Green blue | 25 | 340 |
| 2 | Green | 15 | 110 |
| 3 | Blue | 15 | 100 |
| 4 | Blue | 15 | 130 |
| 5 | Blue | 20 | 150 |
| 6 | Green | 20 | 170 |
| 7 | Green | 20 | 260 |
| 8 | Blue | 25 | 90 |
| 9 | Blue | 25 | 20 |
| 10 | Blue | 20 | 140 |
| 11 | Blue | 20 | 40 |
| 12 | Blue green | 15 | 130 |
| 13 | Blue green | 30 | 380 |
| 14 | Yellow | 10 | 60 |
| 15 | Yellow | 10 | 50 |
| 16 | Yellow | 10 | 30 |
| 17 | Yellow | 10 | 30 |
| 18 | Yellow | 10 | 20 |
| 19 | Yellow | 15 | 70 |
| 20 | Yellow | 10 | 10 |
| 21 | Yellow | 10 | 20 |
| 22 | Yellow | 15 | 30 |

What is claimed is:

1. An electroluminescent device comprising an anode, a cathode and at least one organic compound layer sandwiched therebetween, at least one of said organic compound layers comprising an organic compound represented by the following formula (I) as the constituent ingredient:

(I)

wherein $R^1$ and $R^2$ each independently represents a substituted or unsubstituted ($C_1$-$C_{20}$) alkyl group, a substituted or unsubstituted carbocyclic aromatic ring, or a substituted or unsubstituted (5-membered) heterocyclic aromatic ring, or $R^1$ and $R^2$ together form a 5-15 membered ring;

$Ar^1$ represents a substituted or unsubstituted carbocyclic aromatic ring, or a substituted or unsubstituted (5-13 membered) heterocyclic aromatic ring;

B represents —CH=CH)$_n$Ar$^2$ or

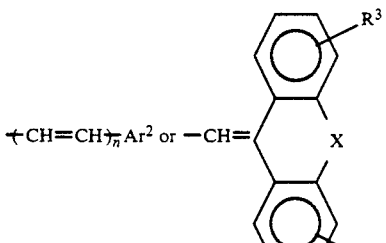

wherein X represents —CH$_2$CH$_2$—, —CH=CH—, —O—, —S— or

$R^3$, $R^4$ and $R^5$ and independently represents a substituted or unsubstituted ($C_1$-$C_{18}$) alkyl group, a substituted or unsubstituted carbocyclic aromatic ring, or a substituted or unsubstituted (6-membered) heterocyclic aromatic ring, Ar$^2$ represents a substituted or unsubstituted (5-13 membered) heterocyclic aromatic ring, and n represents an integer of 1, 2 or 3.

2. The electroluminescent device according to claim 1, wherein in the formula (I), said $R^1$, $R^2$ and $R^5$ each independently represents hydrogen ($C_1$-$C_{12}$) alkyl group, benzyl group, ($C_1$-$C_6$) alkyl-substituted benzyl group, ($C_1$-$C_6$) alkoxy-substituted benzyl group, halogen-substituted benzyl group, phenyl group, ($C_1$-$C_6$) alkyl-substituted phenyl group, ($C_1$-$C_6$) alkoxy-substituted phenyl group, ($C_1$-$C_{12}$)-dialkylamino substituted phenyl group, cyano-substituted phenyl group, halogen-substituted phenyl group, naphthyl group, ($C_1$-$C_6$) alkyl-substituted naphthyl group, ($C_1$-$C_6$) alkoxy-substituted naphthyl group, ($C_1$-$C_{12}$) dialkylamino-substituted naphthyl group, cyano-substituted naphthyl group, halogen-substituted naphthyl group, pyridyl group, ($C_1$-$C_6$) alkyl-substituted pyridyl group, ($C_1$-$C_6$) alkoxy-substituted pyridyl group, ($C_1$-$C_6$) dialkylamino-substituted pyridyl group, cyano-substituted pyridyl group, halogen-substituted pyridyl group, thiophenyl group, ($C_1$-$C_6$) alkyl-substituted thiophenyl group, ($C_1$14 $C_{12}$) alkoxy-substituted thiophenyl group, ($C_1$-$C_6$) dialkylamino-substituted thiophenyl group, cyano-substituted thiophenyl group, halogen-substituted thiophenyl group, furanyl group, ($C_1$-$C_6$) alkyl-substituted furanyl group, ($C_1$-$C_6$) alkoxy-substituted furanyl group, ($C_1$14 $C_{12}$) dialkylamino-substituted furanyl group, cyano-substituted furanyl group, or halogen-substituted furanyl group, said $R^3$ and $R^4$ each independently represents hydrogen, ($C_1$-$C_{12}$) alkyl group, ($C_1$-$C_{12}$) alkoxy group, cyano group, phenyl group, phenoxy group; or halogen atom, and said Ar$^1$ represents phenylene, naphthylene, furandiyl, thiophenediyl, or pyridinediyl, Ar² represents phenyl group, (C₁-C₁₂) alkyl-substituted phenyl group, (C₁-C₁₂) alkoxy-substituted phenyl group, phenoxy-substituted phenyl group, nitro-substituted phenyl group, cyano-substituted phenyl group, halogen-substituted phenyl group, naphthyl group, (C₁-C₁₂) alkyl substituted naphthyl group, (C₁-C₁₂) alkoxy-substituted naphthyl group, phenoxy-substituted naphthyl group, nitro-substituted naphthyl group, cyano-substituted naphthyl group, halogen-substituted naphthyl group, pyridyl group, (C₁14 C₁₂) alkyl-substituted pyridyl group, (C₁-C₁₂) alkoxy-substituted pyridyl group, phenoxy-substituted pyridyl group, nitro-substituted pyridyl group, cyano-substituted pyridyl group, halogen-substituted pyridyl group, quinolyl group, (C₁-C₁₂) alkyl-substituted quinolyl group, (C₁-C₁₂) alkoxy-substituted quinolyl group, phenoxy-substituted quinolyl group, nitro-substituted quinolyl group, cyano-substituted quinolyl group, halogen-substituted quinolyl group, thiophenyl group, (C₁-C₁₂) alkyl-substituted thiophenyl group, (C₁-C₁₂) alkoxy-substituted thiophenyl group, phenoxy-substituted thiophenyl group, nitro-substituted thiophenyl group, cyano-substituted thiophenyl group, halogen-substituted thiophenyl group, furanyl group, (C₁-C₁₂) alkyl-substituted furanyl group, (C₁-C₁₂) alkoxy-substituted furanyl group, phenoxy-substituted furanyl group, nitro-substituted furanyl group, cyano-substituted furanyl group, halogen-substituted furanyl group, benzothiophenyl group, (C₁-C₁₂) alkyl-substituted benzothiophenyl group, (C₁-C₁₂) alkoxy-substituted benzothiophenyl group, phenoxy-substituted benzothiophenyl group, nitro-substituted benzothiophenyl group, cyano-substituted benzothiophenyl group, benzofuranyl group, (C₁-C₁₂) alkyl-substituted benzofuranyl group, (C₁-C₁₂) alkoxy-substituted benzofuranyl group, phenoxy-substituted benzofuranyl group, nitro-substituted benzofuranyl group, cyano-substituted benzofuranyl group, or halogen-substituted benzofuranyl group.

3. The electroluminescent device according to claim 1, wherein said organic compound is selected from the group consisting of the compounds represented by the following formulae:

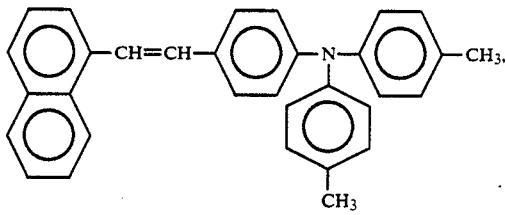

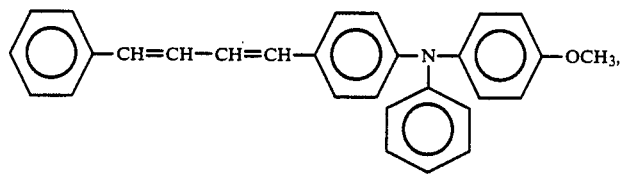

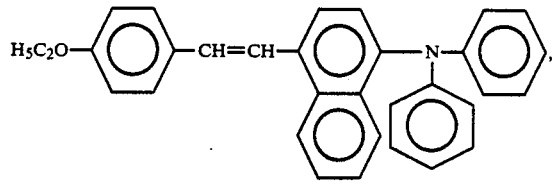

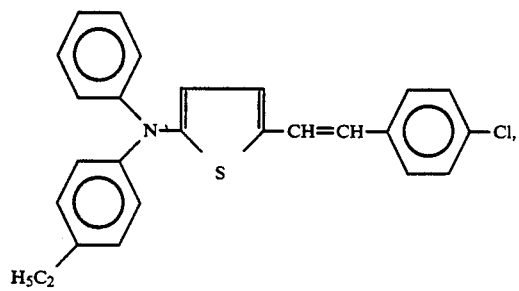

-continued
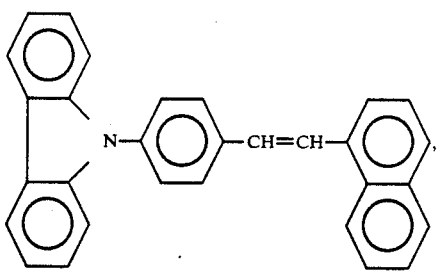
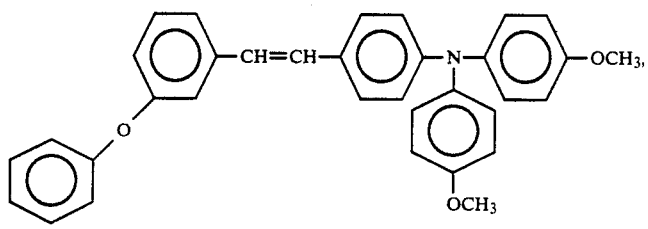
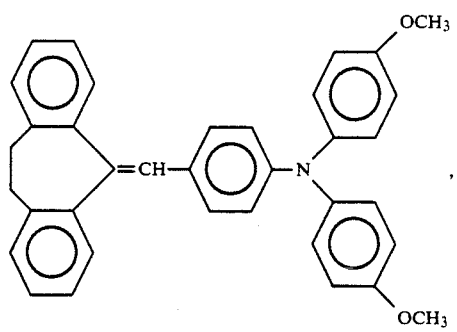
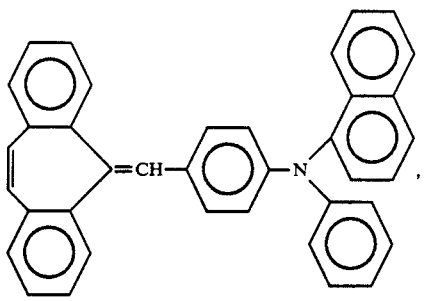
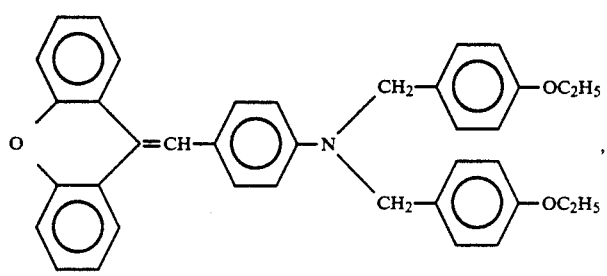

-continued
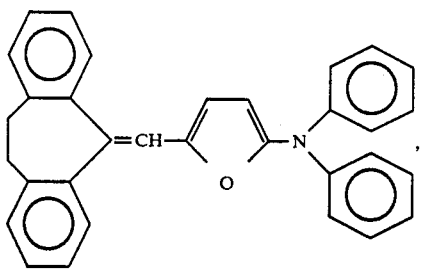
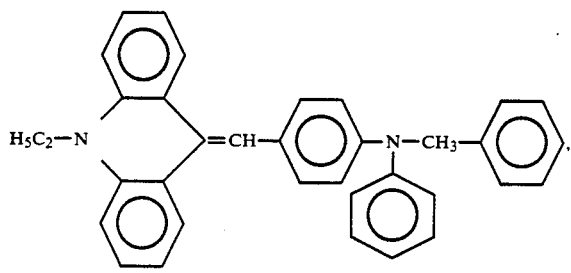
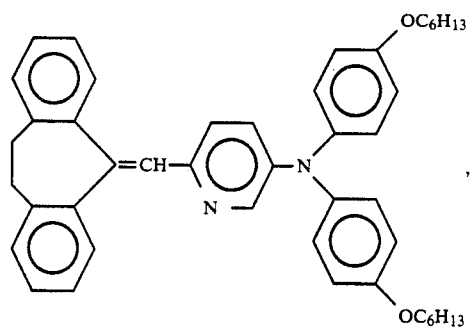
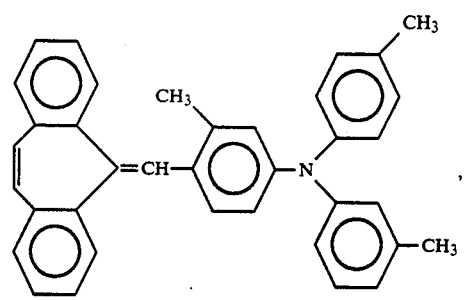
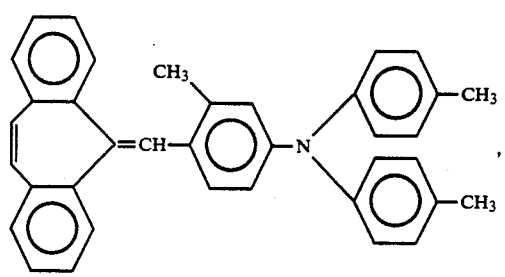

-continued
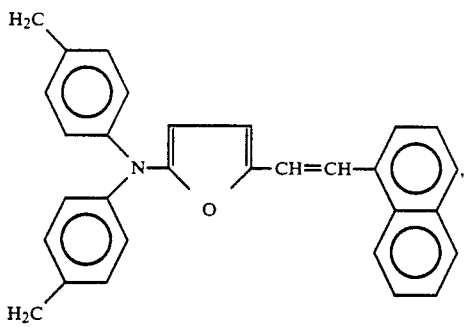
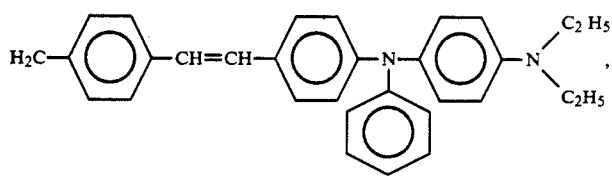
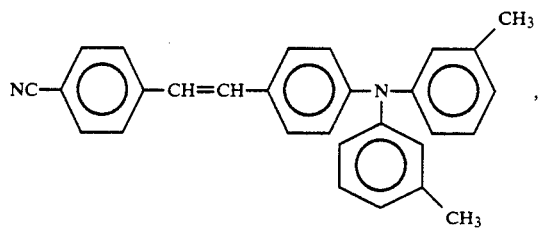
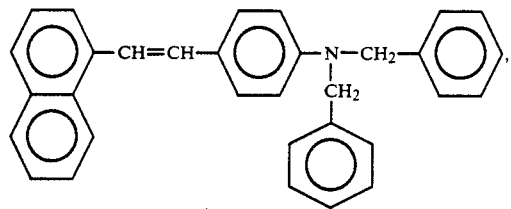
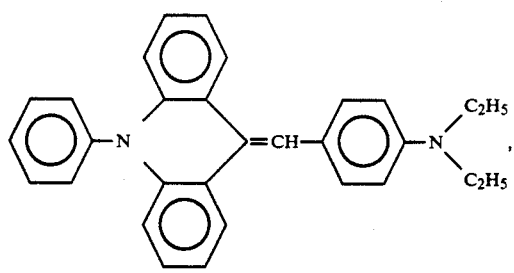
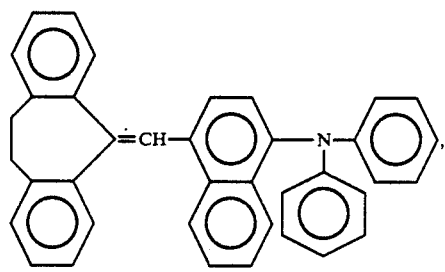

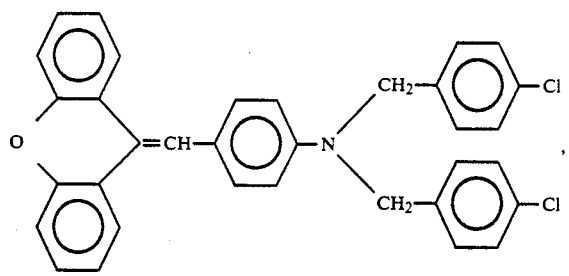
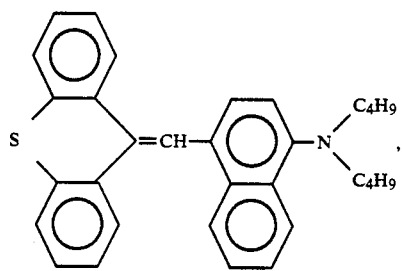
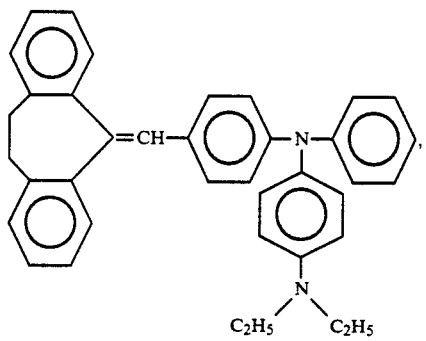
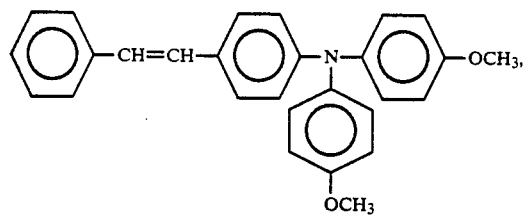
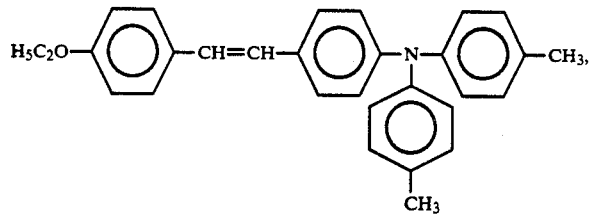
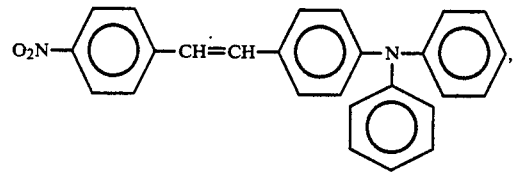

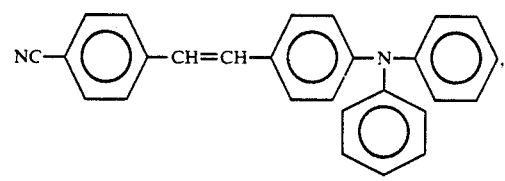
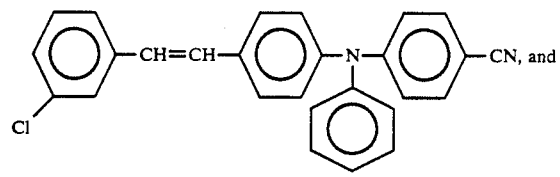
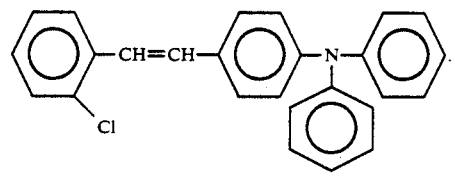
* * * * *